(12) United States Patent
Gangi et al.

(10) Patent No.: US 12,119,385 B2
(45) Date of Patent: Oct. 15, 2024

(54) FIELD EFFECT TRANSISTOR

(71) Applicant: Kabushiki Kaisha Toshiba, Tokyo (JP)

(72) Inventors: Hiro Gangi, Ota (JP); Yasunori Taguchi, Kawasaki (JP); Tomoaki Inokuchi, Yokohama (JP); Yusuke Kobayashi, Yokohama (JP); Hiroki Nemoto, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 17/666,860

(22) Filed: Feb. 8, 2022

(65) Prior Publication Data
US 2022/0384587 A1    Dec. 1, 2022

(30) Foreign Application Priority Data

May 27, 2021 (JP) .................................. 2021-088891

(51) Int. Cl.
*H01L 29/40* (2006.01)
*H01L 29/423* (2006.01)
*H01L 29/78* (2006.01)

(52) U.S. Cl.
CPC .......... *H01L 29/404* (2013.01); *H01L 29/407* (2013.01); *H01L 29/4236* (2013.01); *H01L 29/42368* (2013.01); *H01L 29/7813* (2013.01)

(58) Field of Classification Search
None
See application file for complete search history.

(56) References Cited

U.S. PATENT DOCUMENTS

2007/0126056 A1 * 6/2007 Hirler .................. H01L 29/732
257/E29.066
2014/0054682 A1 * 2/2014 Padmanabhan ....... H01L 29/407
438/270
(Continued)

FOREIGN PATENT DOCUMENTS

| CN | 107851665 A | * | 3/2018 | ....... H01L 21/02293 |
| CN | 110400846 A | * | 11/2019 | ............. H01L 29/78 |

(Continued)

OTHER PUBLICATIONS

U.S. Appl. No. 17/395,910, filed Aug. 6, 2021, Gangi et al.
(Continued)

*Primary Examiner* — Scott B Geyer
(74) *Attorney, Agent, or Firm* — Oblon, McClelland, Maier & Neustadt, L.L.P.

(57) ABSTRACT

A semiconductor device includes a first electrode, a second electrode, a semiconductor layer that includes a first semiconductor region, a second semiconductor region, and a third semiconductor region, a third electrode, a first insulating region, a second insulating region, a fourth electrode that has a plurality of portions consecutive in a first direction, the plurality of portions including a first portion that has a first width in a second direction, a second portion that is located closer to the second electrode than the first portion in the first direction and has a second width smaller than the first width in the second direction, and a third portion that is adjacent to the second portion, located closer to the second electrode than the second portion in the first direction, and has a third width larger than the second width in the second direction, and a third insulating region.

11 Claims, 9 Drawing Sheets

(56) References Cited

U.S. PATENT DOCUMENTS

| | | | |
|---|---|---|---|
| 2014/0167151 A1* | 6/2014 | Yen | H01L 29/7813 438/270 |
| 2014/0319606 A1* | 10/2014 | Bhalla | H01L 29/407 257/334 |
| 2016/0093719 A1 | 3/2016 | Kobayashi et al. | |
| 2017/0040447 A1* | 2/2017 | Deng | H01L 29/7397 |
| 2018/0308943 A1 | 10/2018 | Nishiguchi | |
| 2019/0081173 A1 | 3/2019 | Nishiwaki et al. | |
| 2019/0334000 A1* | 10/2019 | Zundel | H01L 29/42368 |
| 2020/0243656 A1* | 7/2020 | Shibib | H01L 29/404 |
| 2021/0126124 A1* | 4/2021 | Hsieh | H01L 29/7813 |
| 2021/0320178 A1* | 10/2021 | Hossain | H01L 29/407 |
| 2022/0093789 A1* | 3/2022 | Katou | H01L 29/407 |
| 2022/0140133 A1* | 5/2022 | Gangi | H01L 29/7813 257/330 |
| 2022/0149161 A1* | 5/2022 | Hsieh | H01L 29/7813 |
| 2022/0223731 A1* | 7/2022 | Kim | H01L 29/0696 |
| 2022/0262946 A1* | 8/2022 | Blank | H01L 29/407 |
| 2022/0293754 A1* | 9/2022 | Inokuchi | H01L 29/7806 |
| 2022/0293786 A1* | 9/2022 | Hsieh | H01L 21/823462 |
| 2022/0393008 A1* | 12/2022 | Kobayashi | H01L 29/41775 |
| 2023/0078447 A1* | 3/2023 | Nemoto | H01L 29/7813 257/330 |
| 2023/0087151 A1* | 3/2023 | Grebs | H01L 29/66734 257/77 |
| 2023/0132488 A1* | 5/2023 | Cheng | H01L 29/66666 257/330 |
| 2023/0170412 A1* | 6/2023 | Hsu | H01L 29/41 257/330 |
| 2023/0187546 A1* | 6/2023 | Yedinak | H01L 29/7805 257/330 |
| 2023/0282714 A1* | 9/2023 | Chang | H01L 29/407 257/330 |

FOREIGN PATENT DOCUMENTS

| | | | | |
|---|---|---|---|---|
| CN | 110707155 A | * | 1/2020 | H01L 29/78 |
| JP | 2016-072482 A | | 5/2016 | |
| JP | 2016-163019 A | | 9/2016 | |
| JP | 2018-182258 A | | 11/2018 | |
| JP | 2019-054071 A | | 4/2019 | |

OTHER PUBLICATIONS

Kobayashi et al., "100 V Class Multiple Stepped Oxide Field Plate Trench Mosfet (MSO-FP-MOSFET) Aimed to Ultimate Structure Realization", Proceedings of the 27th International Symposium on Power Semiconductor Devices & IC's, 2015, pp. 141-144.

Kobayashi et al., "100-V Class Two-step-oxide Field-Plate Trench MOSFET to Achieve Optimum RESURF Effect and Ultralow On-resistance", Proceedings of the $31^{st}$ International Symposium on Power Semiconductor Devices & ICs, 2019, pp. 99-102.

* cited by examiner

FIELD EFFECT TRANSISTOR

CROSS-REFERENCE TO RELATED APPLICATIONS

This application is based upon and claims the benefit of priority from Japanese Patent Application No. 2021-088891, filed on May 27, 2021, and the entire contents of which are incorporated herein by reference.

FIELD

Embodiments described herein relate generally to a semiconductor device.

BACKGROUND

There is a semiconductor device such as a metal oxide semiconductor field effect transistor (MOSFET) having field plate structure, which includes a field plate electrode under a gate electrode.

By providing the field plate electrode, electric field strength in a drift region of the MOSFET is relieved. As a result, a breakdown voltage (hereinafter, simply referred to as a withstand voltage) between the drain and source of the MOSFET is improved.

In addition, as the withstand voltage is improved, an impurity concentration in the drift region can be set high, and an on-resistance of the MOSFET can be reduced.

That is, according to the MOSFET having the field plate structure, it is possible to improve the breakdown voltage and reduce the on-resistance in the MOSFET.

However, since capacitance is generated between a field plate electrode and a semiconductor layer, an output charge amount and a switching loss of the MOSFET increase. In a semiconductor device such as the MOSFET, the improvement in the breakdown voltage and the reduction in the output charge amount are required.

DETAILED DESCRIPTION

Hereinafter, embodiments will be described with reference to the drawings. In the following description, the same members are denoted by the same reference numerals, and the description of members once described will be appropriately omitted. In addition, in the embodiment, unless otherwise specified, an n-type (first conductivity type) impurity concentration decreases in the order of n+ type and n type.

Figure 1:
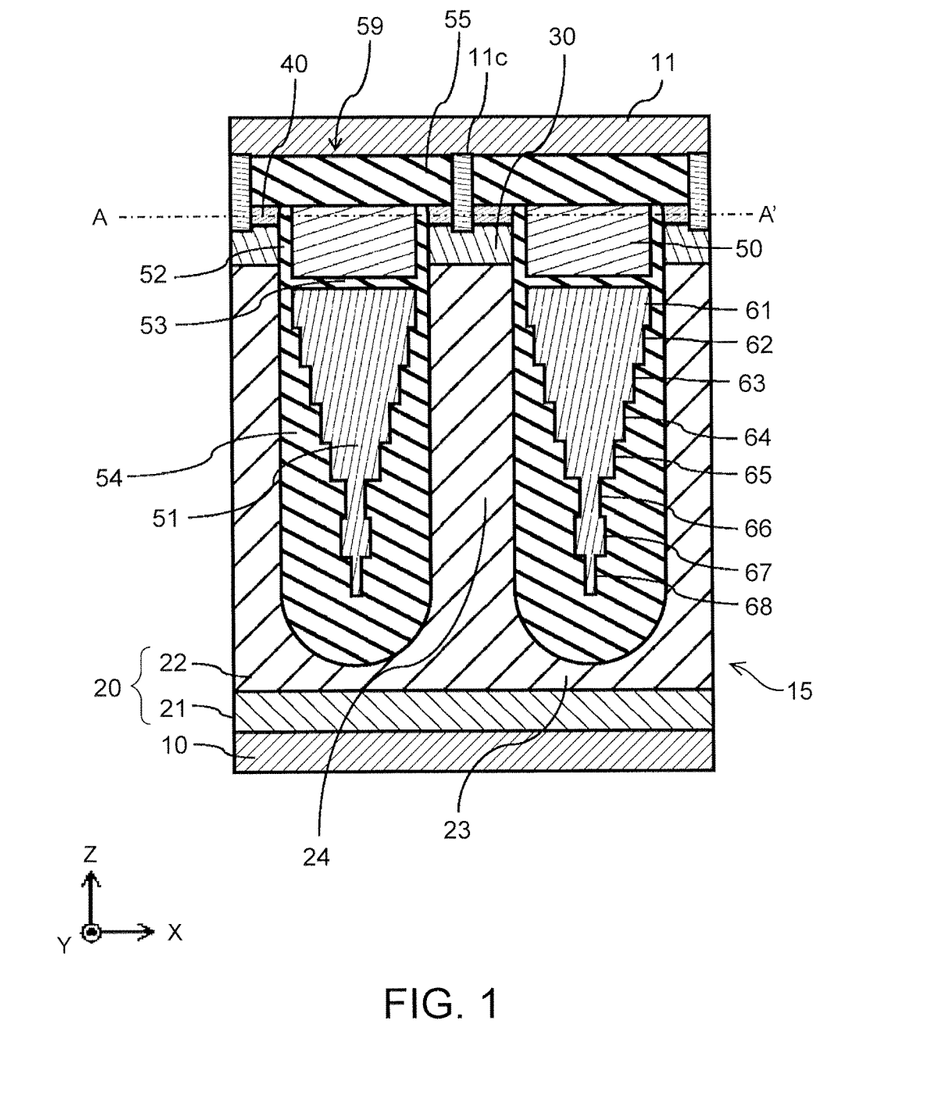
FIG. 1 is a cross-sectional view of a semiconductor device according to an embodiment, and is a cross-sectional view taken along line B-B' in FIG. 2.
Figure 2:
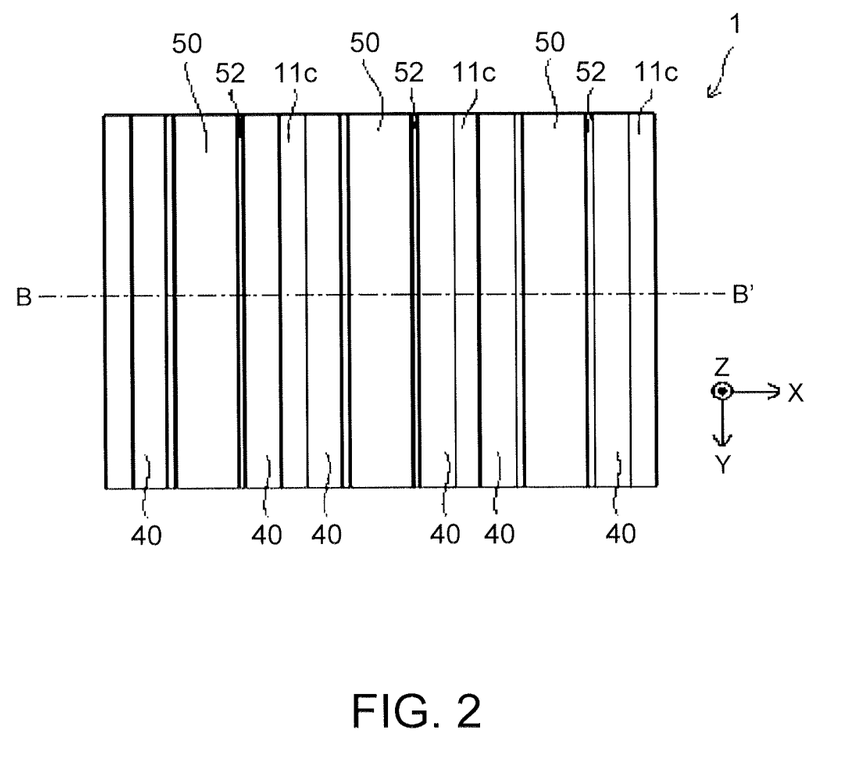
FIG. 2 is a plan view of the semiconductor device according to the embodiment, and is a plan view taken along line A-A' in FIG. 1.

A configuration of a semiconductor device 1 according to an embodiment will be described with reference to FIGS. 1 and 2. FIG. 1 is a cross-sectional view of a main part of a semiconductor device according to a first embodiment, and is a cross-sectional view taken along line B-B' in FIG. 2. FIG. 2 is a plan view of the semiconductor device according to the first embodiment, and is a plan view taken along line A-A' in FIG. 1.

The semiconductor device 1 according to the first embodiment is, for example, a MOSFET having an upper and lower electrode structure. The semiconductor device 1 includes a first semiconductor region 20 (hereinafter, for example, a drain region 21 and a drift region 22), a second semiconductor region 30 (hereinafter, for example, a base region 30), a third semiconductor region 40 (hereinafter, for example, a source region 40), a second electrode 10 (hereinafter, for example, a drain electrode 10), a first electrode 11 (hereinafter, for example, a source electrode 11), a first insulating region 52 (hereinafter, for example, a gate insulating film 52), a second insulating region 55 (hereinafter, for example, an interlayer insulating film 55), a third insulating region 54 (hereinafter, for example, a field plate insulating film 54), a fourth insulating region 53 (hereinafter, for example, an insulating film 53), a third electrode 50 (hereinafter, for example, a gate electrode 50), a fourth electrode 51 (hereinafter, for example, a field plate electrode 51), and a connection region 11c.

Here, a direction from the drain electrode 10 toward the source electrode 11 is defined as a Z direction, a direction intersecting the Z direction is defined as a Y direction, and a direction intersecting the Y direction and the Z direction is defined as an X direction. "Intersecting directions" means that the directions are not parallel, and for example, the directions are orthogonal to each other.

The drain electrode 10 and the source electrode 11 extend in the X direction and the Y direction. Examples of the material of the drain electrode 10 and the material of the source electrode 11 include metals containing at least one selected from the group of aluminum (Al), titanium (Ti), nickel (Ni), tungsten (W), gold (Au), and the like.

The semiconductor layer 15 is located between the drain electrode 10 and the source electrode 11 in the Z direction. The semiconductor layer 15 extends in the X direction and the Y direction. The semiconductor layer 15 includes a drift region 22, a drain region 21, a base region 30, and a source region 40. Examples of the main component of the semiconductor layer 15 include silicon (Si), silicon carbide (SiC), gallium nitride (GaN), or the like.

The semiconductor layer 15 includes semiconductor regions of a first conductivity type and a second conductivity type. For example, the first conductivity type is an n type, and the second conductivity type is a p type. In the embodiment, the first conductivity type may be a p type and the second conductivity type may be an n type. Hereinafter, the first conductivity type is an n type, and the second conductivity type is a p type.

As an n-type conductivity type impurity element contained in the semiconductor layer 15, for example, phosphorus (P), arsenic (As), or the like is applied. As a p-type conductivity type impurity element contained in the semiconductor layer 15, for example, boron (B) or the like is applied.

The drain region 21 of a first conductivity type (n+ type) is provided on the drain electrode 10. The drain region 21 is located between the drain electrode 10 and the source electrode 11 in the Z direction. The drain region 21 extends in the X direction and the Y direction. The drain region 21 is electrically connected to the drain electrode 10.

The drift region 22 of a first conductivity type (n type) is provided on the drain region 21. The drift region 22 is located between the drain region 21 and the source electrode 11 in the Z direction. The drift region 22 includes a first drift portion 23 and a second drift portion 24. The first drift portion 23 extends in the X direction and the Y direction. A plurality of second drift portions 24 are provided at intervals in the X direction. The second drift portion 24 extends in the Y direction. The second drift portion 24 extends from the first drift portion 23 toward the source electrode 11 in the Z direction.

The base region 30 of a second conductivity type (p type) is selectively provided on the second drift portion 24. A plurality of base regions 30 are provided at intervals in the X direction. The base region 30 extends in the Y direction. The base region 30 is located between the drift region 22 and the source electrode 11 in the Z direction. The base region 30 is connected to the source electrode 11 via the connection region 11c to be described later.

The source region 40 of the first conductivity type (n-type) is selectively provided on the base region 30. A plurality of source regions 40 are provided at intervals in the X direction. The base region 30 extends in the Y direction. The source region 40 is located between the base region 22 and the source electrode 11 in the Z direction. The source region 40 is connected to the source electrode 11 via the connection region 11c to be described later.

The gate electrode 50 is located between the first drift portion 23 and the source electrode 11 in the Z direction. The gate electrode 50 faces the second drift region 24, the base region 30, and the source region 40 via the gate insulating film 52 in the X direction. The gate electrode 50 is located between the adjacent second drift regions 24 in the X direction. The gate electrode 50 extends in the Y direction. The gate electrode 50 is provided in a trench extending from the source electrode 11 toward the drain electrode 10 in the Z direction. In addition, the plurality of gate electrodes 50 are periodically arranged at intervals in the X direction. Examples of the material of the gate electrode 50 include polysilicon.

The field plate electrode 51 is provided closer to the drain electrode 10 than the gate electrode 50 in the Z direction. The field plate electrode 51 faces the drift region 22 via the field plate insulating film 54 in the X direction and the Z direction. The field plate electrodes 51 are, for example, periodically arranged at intervals in the X direction. The field plate electrode 51 is located between the adjacent second drift portions 24 in the X direction. The field plate electrode 51 extends in the Y direction. The field plate electrode 51 is provided in a trench extending from the source electrode 11 toward the drain electrode 10 in the Z direction. The field plate electrode 51 and the gate electrode 50 are arranged in the Z direction. A detailed shape of the field plate electrode 51 will be described later.

The insulating region 59 includes a gate insulating film 52, an insulating film 53, a field plate insulating film 54, and an interlayer insulating film 55. The insulating region 59 can be integrally made of the same material or may be made of different materials. The insulating region 59 includes, for example, an insulating material such as silicon oxide or silicon nitride.

The field plate insulating film 54 is located between the field plate electrode 51 and the first and second drift portions 23, 24, and electrically separates the field plate electrode 51 from the drift region 22. The field plate insulating film 54 covers the field plate electrode 51. The field plate insulating film 54 extends in the Z direction.

The insulating film 53 is located between the field plate electrode 51 and the gate electrode 50. The insulating film 53 electrically separates the field plate electrode 51 from the gate electrode 50.

The gate insulating film 52 is located between the gate electrode 50 and the drift region 22, the base region 30, and the source region 40 in the X direction. The gate insulating film 52 electrically separates the gate electrode 50 from the drift region 22, the base region 30, and the source region 40.

The interlayer insulating film 55 is located between the source electrode 11 and the gate electrode 50, the gate insulating film 52 and the source region 40 in the Z direction. The interlayer insulating film 55 electrically separates the gate electrode 50 from the source electrode 11.

The connection region 11c is provided to penetrate the interlayer insulating film 55 in the Z direction. The connection region 11c electrically connects the source region 40 and the base region 30 to the source electrode 11. The source electrode 11 can include the connection region 11c. The connection region 11c may include the same material as source electrode 11, and can be formed as a part of source electrode 11. The connection region 11c may include a material different from that of the source electrode 11.

Figure 3:
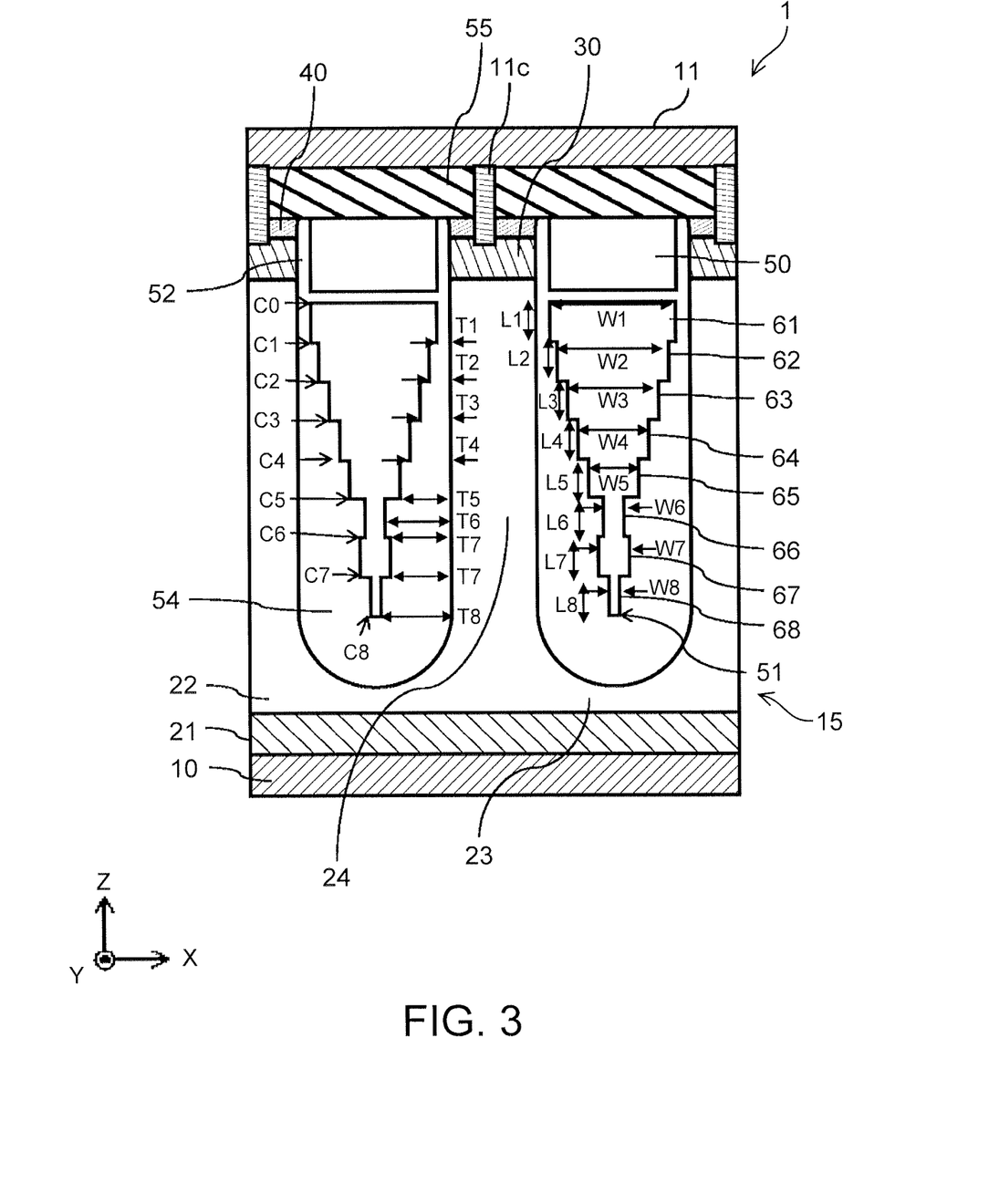
FIG. 3 is a cross-sectional view illustrating a corner portion, a thickness, a width, and a length of the semiconductor device according to the embodiment.

Next, a detailed shape of the field plate electrode 51 will be described with reference to FIG. 3. FIG. 3 is a cross-sectional view illustrating positions of a corner portion, a thickness, a width, and a length of the semiconductor device according to the embodiment. FIG. 3 is a cross-sectional view illustrating a range equivalent to that in FIG. 1, but some hatching and some reference signs are omitted in order to improve visibility.

The field plate electrode 51 has three or more portions consecutive in the Z direction. In the semiconductor device 1 of the embodiment, the field plate electrode 51 has eight portions 61 to 68. The portions 61 to 68 are different in width from a portion adjacent to each other in the Z direction. Here, the width refers to a length in the X direction.

The field plate electrode 51 has corner portions C0 to C8 protruding toward the insulating region 54. When the shape of the corner portion is rounded, an intersection of a boundary line extending in the Z direction between the portions 61 to 68 and the field plate insulating film 52 and a boundary line extending in the X direction between the portions 61 to 68 and the field plate insulating film 52 may be set as the corner portion.

Each of the portions 61 to 68 has widths W1 to W8 in the X direction. As illustrated in FIG. 3, when the portions 61 to 68 extend along the Z direction, a length in the X direction at an arbitrary location in the Z direction may be set as a width. When the portions 61 to 68 extend obliquely with respect to the Z direction, the length in the X direction at the central portion in the Z direction of each portion may be set as the width. Alternatively, each of the portions 61 to 65, 67, and 68 having the corner portions C0 to C8 may have a width that is a length of the corner portions C0 to C8 in the X direction.

Each of the portions 61 to 68 has lengths L1 to L8 in the Z direction.

A distance between the portions 61 to 68 and the drift region 22 in the X direction, that is, the thickness of the field plate insulating film 52 sandwiched between the portions 61 to 68 and the drift region 22 is thicknesses T1 to T8, respectively.

The portion 61 is located closest to the source electrode 11 in the Z direction among the plurality of portions included in the field plate electrode 51. The portion 61 has the largest width in the X direction, that is, the width W1 among the plurality of portions included in the field plate electrode 51. The portion 61 has the corner portions C0 and C1.

The portion 62 is adjacent to the portion 61 and is located closer to the drain electrode 10 than the portion 61 in the Z direction. The width W2 of the portion 62 in the X direction is smaller than the width W1 of the portion 61. The portion 62 has the corner portion C2.

The portion 63 is adjacent to the portion 62 and is located closer to the drain electrode 10 than the portion 62 in the Z direction. The width W3 of the portion 63 in the X direction is smaller than the width W2 of the portion 62. The portion 63 has the corner portion C3. The portion 63 corresponds to, for example, a fifth portion.

The portion 64 is adjacent to the portion 63 and is located closer to the drain electrode 10 than the portion 63 in the Z direction. The width W4 of the portion 64 in the X direction is smaller than the width W3 of the portion 63. The portion 64 has the corner portion C4. The portion 64 corresponds to, for example, a fourth portion.

The portion 65 is adjacent to the portion 64 and is located closer to the drain electrode 10 than the portion 64 in the Z direction. The width W5 of the portion 65 in the X direction is smaller than the width W4 of the portion 64. The portion 65 has the corner portion C5. The portion 65 corresponds to, for example, a first portion.

The portion 66 is adjacent to the portion 65 and is located closer to the drain electrode 10 than the portion 65 in the Z direction. The width W6 of the portion 66 in the X direction is smaller than the width W5 of the portion 65. The portion 66 does not include a corner portion. The portion 66 corresponds to, for example, a second portion.

The portion 67 is adjacent to the portion 66 and is located closer to the drain electrode 10 than the portion 66 in the Z direction. The width W7 of the portion 67 in the X direction is larger than the width W6 of the portion 66. The portion 67 has the corner portions C6 and C7. The portion 67 corresponds to, for example, a third portion.

The portion 68 is adjacent to the portion 67 and is located closer to the drain electrode 10 than the portion 67 in the Z direction. The portion 68 is located closest to the drain electrode 10 in the Z direction among the plurality of portions included in the field plate electrode 51. The width W8 of the portion 68 in the X direction is smaller than the width W7 of the portion 67. The portion 68 has the corner portion C8. The portion 68 corresponds to, for example, a sixth portion.

The field plate electrode 51 satisfies the following relationship with respect to the widths W1 to W8 of the portions 61 to 68.

$$W8<W7$$

$$W6<W7$$

$$W8<W6<W5<W4<W3<W2<W1$$

Since the field plate insulating film 52 extends in the Z direction, the thicknesses T1 to T8 of the portions adjacent to the portion 61 to 68 having the large widths W1 to W8 become small. Each thickness satisfies the following relationship.

$$T7<T8$$

$$T7<T6$$

$$T1<T2<T3<T4<T5<T6<T8$$

The field plate electrode 51 has (Expression 1) "The widths W1 to W5, W7, and W8 of the portions 61 to 65, 67, and 68 excluding the portion 66 increase from the drain electrode 10 toward the source electrode 11 in the Z direction."

(Expression 1) can be rephrased as (Expression 2) "Among the plurality of portions 68 to 61 included in the field plate electrode 51, the portions 67 and 65 to 61 having a larger width than at least one of the portions adjacent to each other in the Z direction have a larger width (W7<W5<W4<W3<W2<W1) from the drain electrode 10 toward the source electrode 11 in the Z direction."

In other words, (Expression 1) can also be expressed as (Expression 3) "As it goes from the drain electrode 11 toward the source electrode (Z direction), the width at the corner portions C8 to C0 of the field plate electrode 51 monotonically increases (W8<W7<W5<W4<W3<W2<W1." The monotonically increasing width means that the width increases without decreasing, and includes that the widths at the corner portions C6 and C7 are the same W7.

In other words, from the viewpoint of the thickness of the field plate insulating film 54, (Expression 1) can also be expressed as (Expression 4) "As it goes from the drain electrode 10 toward the source electrode 11 (Z direction), the thickness of the field plate insulating film 54 in the X direction at the position in contact with the corner portions C8 to C0 of the field plate electrode 51 monotonically decreases (T8>T7>T5>T4>T3>T2>T1)." The monotonically decreasing thickness means that the thickness decreases without increasing, and includes that the thicknesses of the portions in contact with the corner portions C6 and C7 are the same T7.

Focusing on a part of the field plate electrode 51, the widths of the portion 66 and the plurality of portions 61 to 65 closer to the source electrode 11 than the portion 66 in the Z direction gradually increase from the drain electrode 10 toward the source electrode 11 in the Z direction. The widths of the plurality of portions 67 and 68 closer to the drain electrode 10 than the portion 66 in the Z direction gradually increase from the drain electrode 10 toward the source electrode 11 in the Z direction.

The operation of the semiconductor device 1 will be described. The semiconductor device 1 operates when a potential is applied to the drain electrode 10, the source electrode 11, and the gate electrode 50 from a power supply device and a driving device not illustrated in FIGS. 1 to 3. Hereinafter, the potential applied to the source electrode 11 is set as a reference (0 V). A potential of 0 V is applied to the source electrode 11, and 50 V, for example, is applied to the drain electrode 10 when turned off. At the time of switching, a voltage borne by the MOSFET instantaneously increases due to parasitic inductance in the power supply device, and thus, for example, 100 V is applied to the drain electrode 10.

When the semiconductor device 1 is turned on, a potential higher than a threshold potential Vth is applied to the gate electrode 50. As a result, a channel is formed in the base region 30, and a current flows from the drain electrode 10 to the source electrode 11 through the drain region 21, the drift region 22, the base region 30, and the source region 40.

When the semiconductor device 1 is turned-off, a potential lower than the threshold potential Vth is applied to the gate electrode 50. No channel is formed in the base region 30, and no current flows between the source electrode 11 and the drain electrode 10.

It will be described that the semiconductor device 1 can realize a high withstand voltage and a low on-resistance.

When the semiconductor device 1 is turned off, an electric field due to a voltage between the source and the gate is generated in a semiconductor region located between the field plate electrodes 51 adjacent to each other, particularly, in the drift region 22. The concentration of the electric field is one of the causes of destruction of the semiconductor layer 15. Since a potential difference is generated between the drift region 22 and the base region 30, a strong electric field is generated particularly at an interface between the drift region 22 and the base region 30. The field plate electrode 51 extending from the source electrode 11 toward the drain electrode 10 disperses an electric field applied to the drift region 22 and forms a depletion layer in the drift region 22, thereby improving the withstand voltage of the semiconductor device 1.

Since the field plate electrode 51 has the corner portions C0 to C8 protruding toward the insulating region 54, the electric field concentrates in the vicinity of the corner portions C1 to C9. In other words, (virtual) equipotential lines extending along the field plate electrode 51 are partially concentrated at the corner portions C1 to C8 where the width of the field plate electrode 51 increases. Since the dense equipotential lines are ejected from the field plate insulating film 54 to the drift region 22 so as to be away from the field plate electrode 51, the electric field is dispersed in the entire field plate electrode 51.

Since the electric field is efficiently dispersed by the "In the Z direction, the widths W1 to W5, W7, and W8 of the portions 61 to 65, 67, and 68 excluding the portion 66 increase from the drain electrode 10 toward the source electrode 11.", the semiconductor device 1 can realize a high withstand voltage. Furthermore, since the semiconductor device 1 can secure the withstand voltage even if the impurity amount included in the drift region 22 increases, the on-resistance can be reduced.

It will be described that the semiconductor device 1 can realize a low output charge amount.

"The field plate electrode 51 has a portion 66 having a smaller width than both portions (portions 65 and 67) adjacent to each other in the Z direction (W5>W6, W7>W6)." In the field plate electrode 51, since the distance between the portion 66 having no corner portion and the n drift region 22 in the X direction is large, the capacitance in the portion 66 can be reduced. Therefore, in the semiconductor device 1, the output charge amount is suppressed, and the switching loss can be reduced.

A configuration of a semiconductor device 4 of a reference example will be described.

Figure 4:
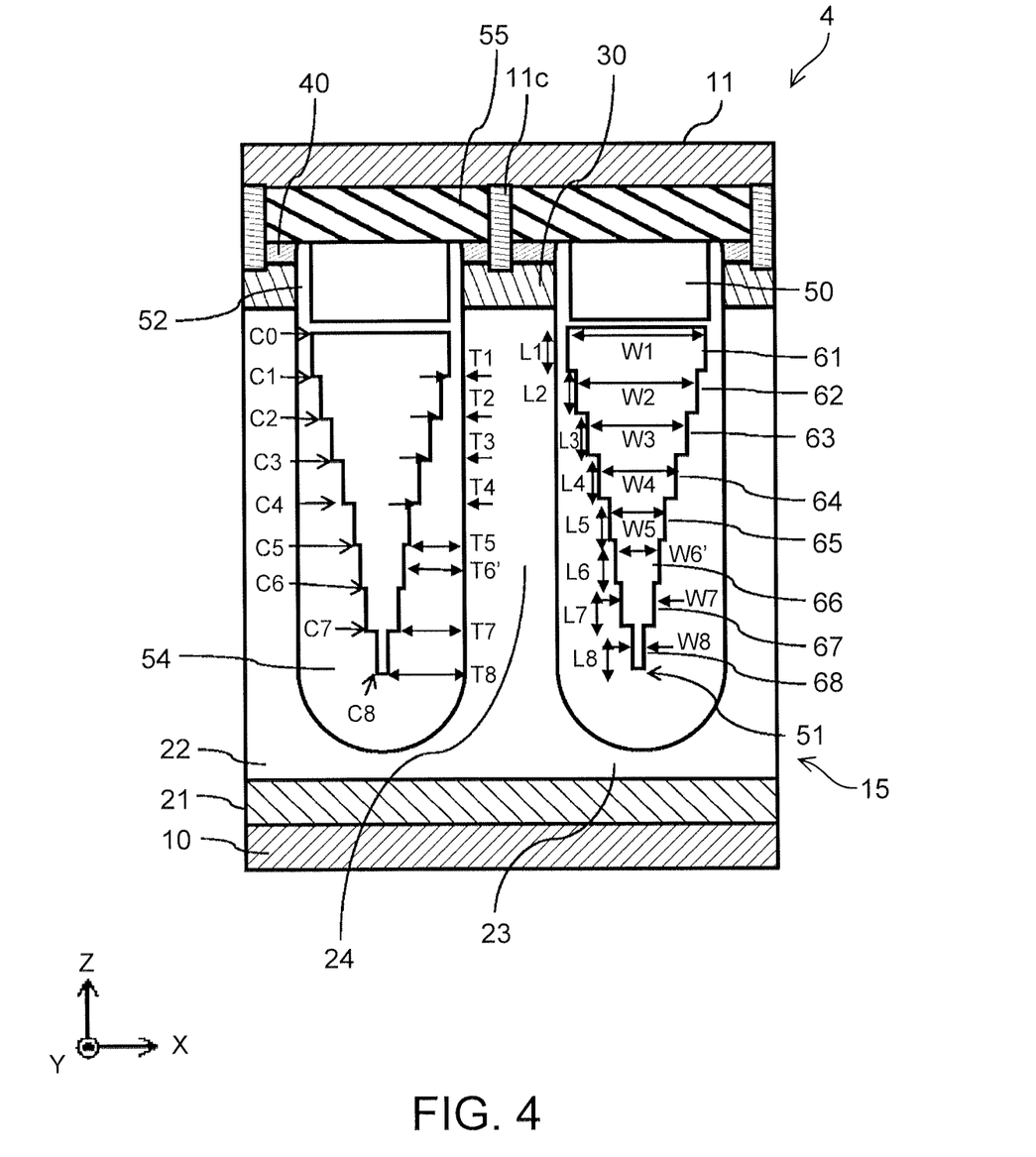
FIG. 4 is a cross-sectional view of a semiconductor device according to a reference example.

FIG. 4 is a cross-sectional view of the semiconductor device 4 according to the reference example. The semiconductor device 4 of the reference example is different from the semiconductor device 1 in a width W6' of the portion 66. In the semiconductor device 4 of the reference example, the thickness of the field plate insulating film 54 adjacent to the portion 66 is T6'.

In the reference example, the plurality of portions 68 to 61 of the field plate electrode 51 has a larger width (W8<W7<W6'<W5<W4<W3<W2<W1) from the drain electrode 10 toward the source electrode 11 (Z direction). In the reference example, the corner portion C6 is included in the portion 66. The semiconductor device 4 of the reference example is configured to satisfy (Expression 1), (Expression 2), and (Expression 3) described above. In the reference example, "The field plate electrode 51 has a smaller width than both adjacent portions in the Z direction." is not included.

The withstand voltage and the output charge amount of the semiconductor device 1 will be described in comparison with the reference example.

The withstand voltage and the output charge amount of the semiconductor devices 1 and 4 were simulated under the following conditions.

$$W1=1.400(nm), W2=1.301(nm), W3=1.188(nm),$$
$$W4=0.909(nm), W5=0.550(nm), W6=0.314(nm),$$
$$W6'=0.480(nm), W7=0.400(nm), W8=0.358(nm).$$

$$L1=0.438(nm), L2=0.358(nm), L3=0.410(nm),$$
$$L4=0.398(nm), L5=0.523(nm), L6=0.475(nm),$$
$$L7=0.516(nm), L8=0.478(nm).$$

$$T1=0.089(nm), T2=0.139(nm), T3=0.195(nm),$$
$$T4=0.335(nm), T5=0.515(nm), T6=0.632(nm),$$
$$T6'=0.549(nm), T7=0.589(nm), T8=0.610(nm).$$

In the simulation, in a state where 0 V is applied to the source electrode 11 and the gate electrode 50, the potential of the drain electrode 10 increases from 0 V to +50 V, and the capacitance between the source and the drain when the potential is vibrated at a frequency of 1 MHz was calculated. The output charge amount was calculated from the total amount of charges per unit area accumulated in the capacitance between the source and the drain.

Figure 5A:
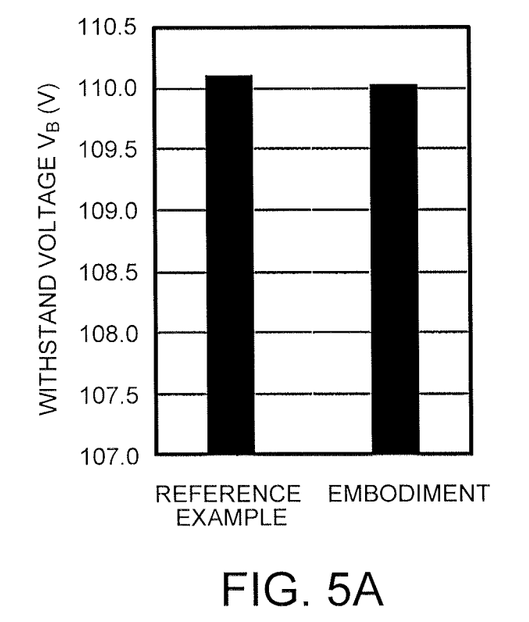
FIG. 5A is a graph plotting a simulation result of a withstand voltage $V_B$ (V) of the semiconductor device.
Figure 5B:
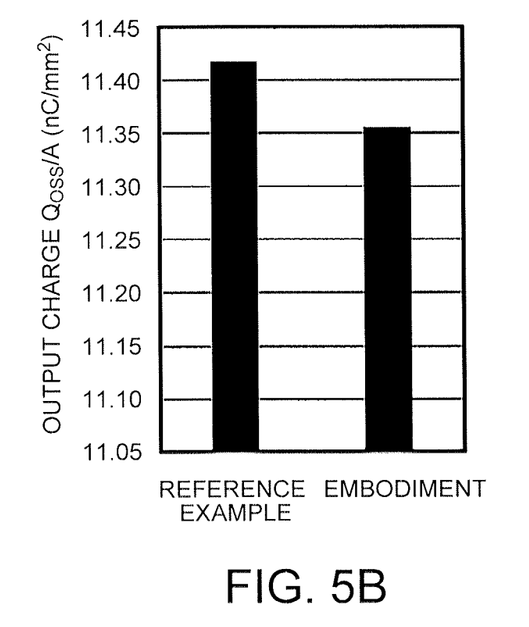
FIG. 5B is a graph plotting a simulation result of an output charge amount $Q_{OSS}/A$ (nC/mm$^2$) of the semiconductor device.

FIG. 5A is a graph plotting simulation results of the withstand voltage $V_B$ (V) of the semiconductor device 1 (embodiment) and the semiconductor device 4 (reference example) FIG. 5B is a graph plotting simulation results of the output charge amount $Q_{OSS}/A$ (nC/mm$^2$) of the semiconductor device 1 (embodiment) and the semiconductor device 4 (reference example).

The withstand voltage V of the semiconductor device 1 of the embodiment was 110.0 (V), which was substantially the same value as 110.1 (V) of the withstand voltage of the semiconductor device 4 of the reference example. The semiconductor device 1 has obtained a result showing a high withstand voltage comparable to that of the semiconductor device 4 having a configuration satisfying (Expression 1), (Expression 2), and (Expression 3) similarly to the semiconductor device 1. The output charge amount of the semiconductor device 1 of the embodiment was 11.36 (nC/mm$^2$), which was lower than the output charge amount of 11.42 (nC/mm$^2$) of the semiconductor device 4 of the reference example.

As described above, the semiconductor device 1 according to the embodiment can achieve both the high withstand voltage and the low output charge amount.

A modification of the embodiment will be described.

Figure 6:
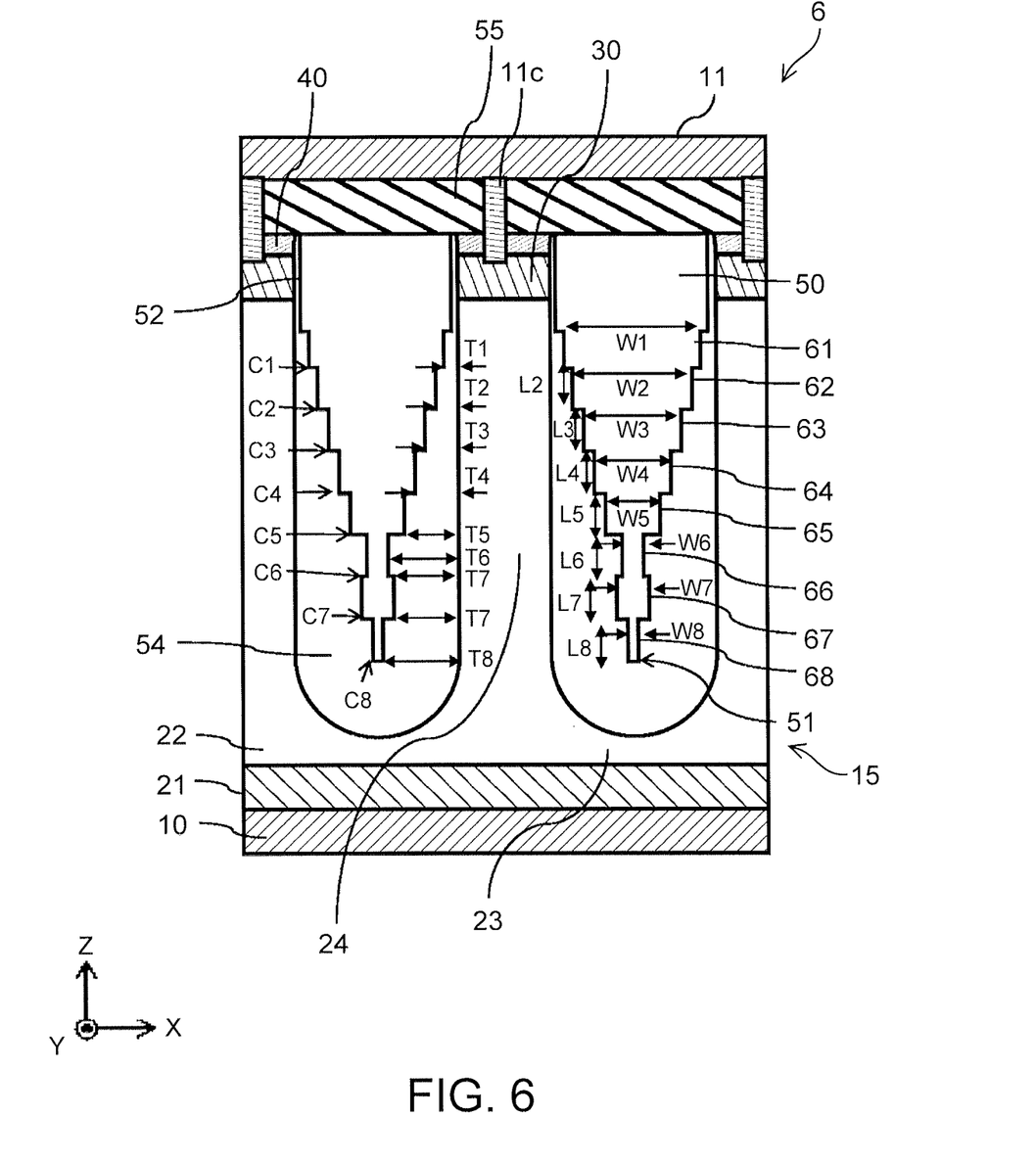
FIG. 6 is a cross-sectional view of a semiconductor device according to a first modification.

FIG. 6 is a cross-sectional view of a semiconductor device according to a first modification. In a semiconductor device 6 according to a first modification, a field plate electrode 51 and a source electrode 11 are electrically separated from each other, and the field plate electrode 51 and the gate electrode 50 are electrically connected to each other.

Figure 7:
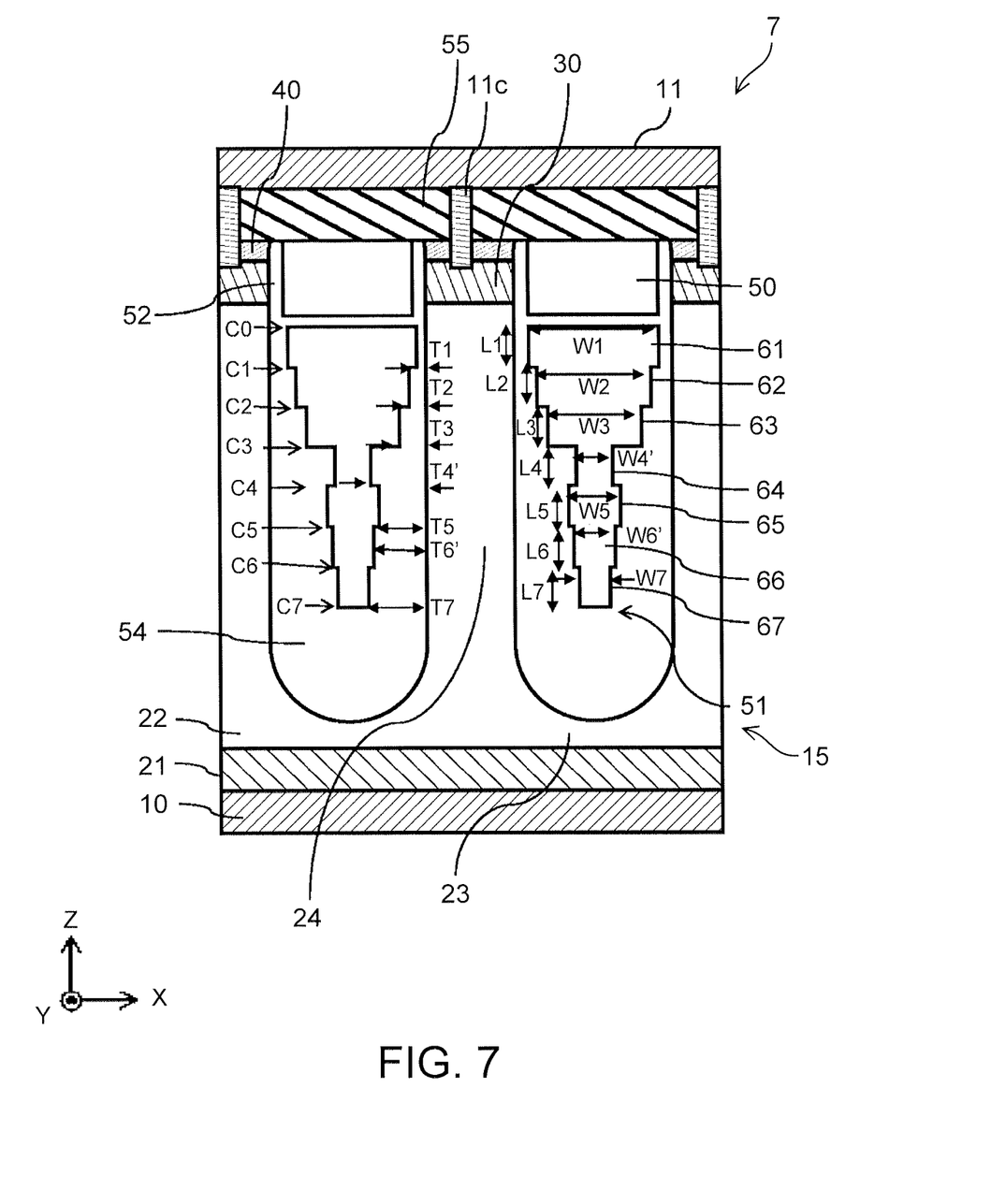
FIG. 7 is a cross-sectional view of a semiconductor device according to a second modification.

FIG. 7 is a cross-sectional view of a semiconductor device according to a second modification. As the embodiment, an example in which the number of portions included in the field plate electrode 51 and the number of widths thereof are 8 has been described, but the number of portions and the number of widths may be other numbers of 3 or more. As the embodiment, an example in which a portion having a smaller width than the adjacent portion in the Z direction is a portion 66 has been described, but the portion may not be the portion 66 as long as it is a portion other than the portion located at the most end in the Z direction. For example, as in a semiconductor device 7 according to a second modification illustrated in FIG. 7, the number of portions included in the field plate electrode 51 and the number of widths thereof may be 7, and a width W4 of a portion 64 may be W4'<W5 and W4'<W3. Note that in the field plate electrode 51 of the semiconductor device 7, a width W4 of a portion 64 where a distance between a field plate electrode 51 and an n drift region 22 is shorter than that of the portion 66 becomes small, and an output charge amount becomes small. In the second modification, the portion 61 corresponds to a fifth portion, the portion 62 corresponds to a fourth portion, the portion 63 corresponds to a first portion, the portion 64 corresponds to a second portion, the portion 65 corresponds to a third portion, the portion 66 corresponds to a sixth portion, and the portion 67 corresponds to a seventh portion.

Figure 8:
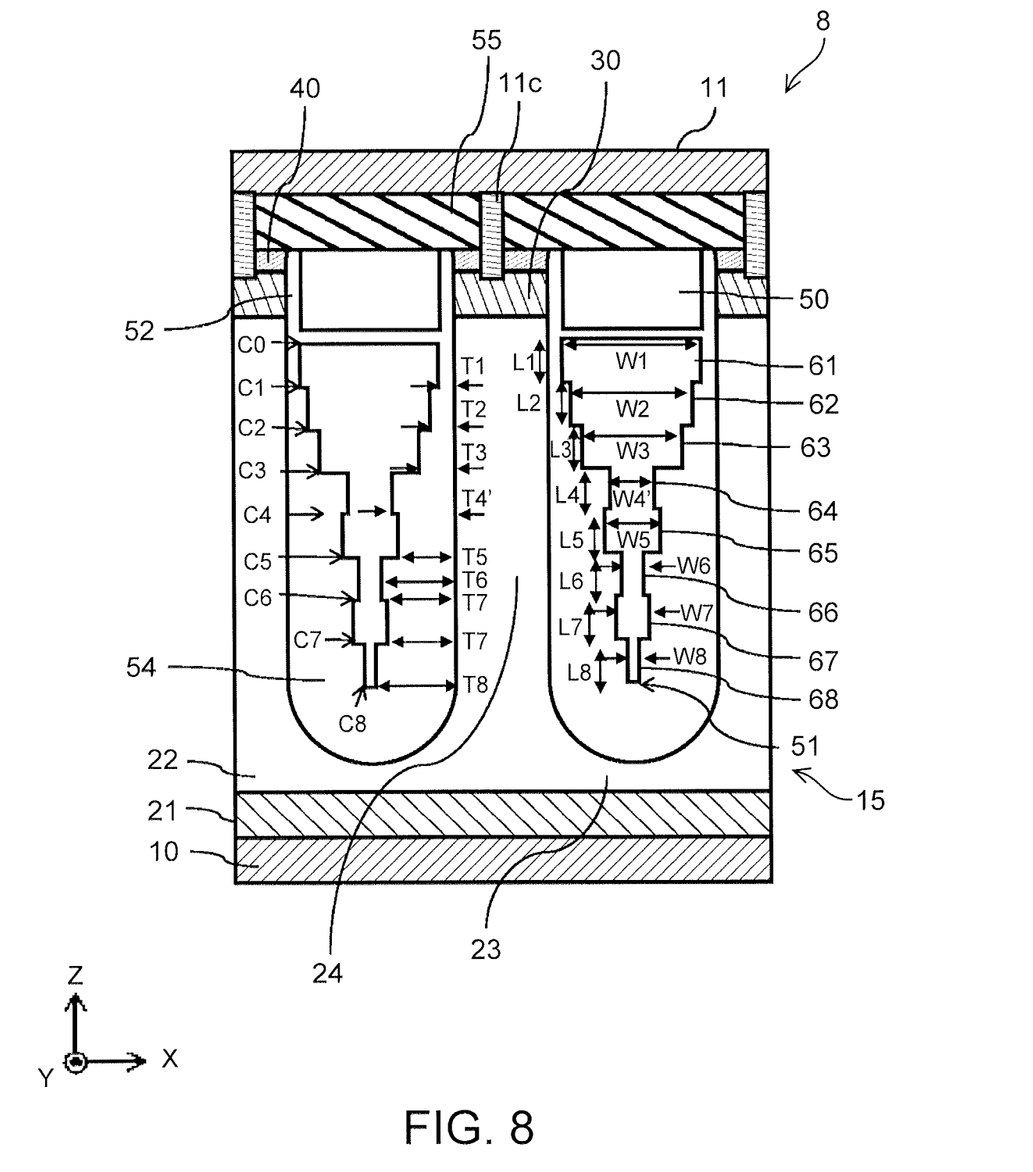
FIG. 8 is a cross-sectional view of a semiconductor device according to a third modification.

FIG. 8 is a cross-sectional view of a semiconductor device according to a third modification. A portion of the field plate electrode 51 having a smaller width than both portions adjacent to each other in the Z direction is not limited to one of the portion 66. For example, as in a semiconductor device 8 of the third modification illustrated in FIG. 8, the field plate electrode 51 may have portions 64 and 66 having a smaller width than both portions adjacent to each other in the Z direction. In the semiconductor device 8 of the modification, since the width of many portions is smaller than that of the semiconductor device 1 of the first embodiment, a low output charge amount can be realized. In addition, the number of corner portions maintaining the withstand voltage does not change as compared with the semiconductor device 1, and the semiconductor device 8 can also realize a high withstand voltage.

Figure 9:
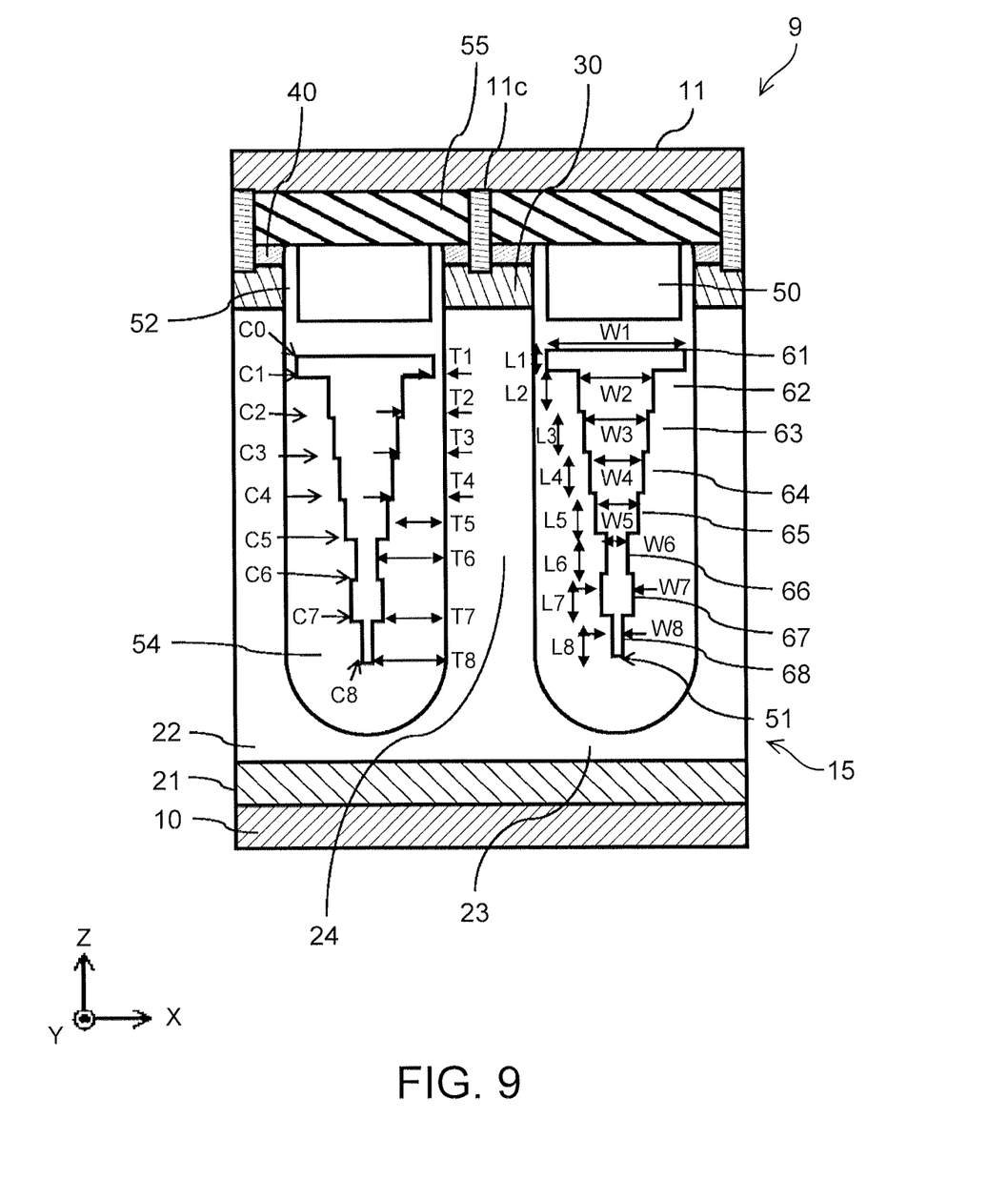
FIG. 9 is a cross-sectional view of a semiconductor device according to a fourth modification.

FIG. 9 is a cross-sectional view of a semiconductor device according to a fourth modification. The field plate electrode 51 of the semiconductor device 9 according to the fourth modification satisfies the following relationship with respect to the width and the length.

$$(W1/L1)/(W2/L2)>2.5$$

By satisfying this relationship, the portion 61 has a shape extremely protruding more than the other portions 62 to 68, and the dispersion effect of the electric field becomes strong. By enhancing the dispersion effect of the electric field in the portion 61 close to the boundary between the drift region 22 and the base region 30 where a strong electric field is generated, the semiconductor device 9 acquires a high withstand voltage.

The semiconductor device of the above embodiments has been described assuming that the second drift portion 24, the base region 30, the source region 40, the gate electrode 50, and the like have a stripe shape extending in the Y direction, but the gate electrode 50 may have a mesh shape or a dot shape.

Further, in the above embodiments, the field plate electrode 51 may be electrically connected to the source electrode 11.

In the above embodiments, a p-type carrier concentration in the base region 30 is preferably $1.0\times10^{17}/cm^3$ or more and $1.0\times10^{18}/cm^3$ or less. An n-type carrier concentration in the source region 40 is preferably $1.0\times10^{18}/cm^3$ or more and $1.0\times10^{20}/cm^3$ or less. An n-type carrier concentration in the drain region 21 is preferably $1.0\times10^{18}/cm^3$ or more and $1.0\times10^{20}/cm^3$ or less. The impurity concentration in the semiconductor region may be substantially the same as the carrier concentration in the semiconductor region.

In the embodiment, the information regarding the shape of the semiconductor region and the like is obtained by, for example, electron microscope observation. The information regarding the impurity concentration in the semiconductor region is obtained by, for example, energy dispersive X-ray spectroscopy (EDX), secondary ion mass spectrometry (SIMS), or the like. The information on the carrier concentration in the semiconductor region is obtained by, for example, scanning capacitance microscopy (SCM) or the like.

The above-described embodiment and the modifications thereof can be realized by appropriately combining. According to the embodiment and the modifications thereof described above, it is possible to provide a semiconductor device that achieves both a high withstand voltage and a low output charge amount.

Although some embodiments of the present invention have been described, these embodiments are presented as examples and are not intended to limit the scope of the invention These novel embodiments can be implemented in various other forms, and various omissions, replacements, and changes can be made without departing from the spirit of the invention. The embodiments or modifications thereof are included in the scope of the invention described in the claims and the scope thereof as well as in the scope or gist of the description.

What is claimed is:

1. A semiconductor device, comprising:
    a first electrode;
    a second electrode;
    a semiconductor layer that includes a first semiconductor region of a first conductivity type, a second semiconductor region of a second conductivity type, and a third semiconductor region of the first conductivity type, the first semiconductor region of the first conductivity type being located between the first electrode and the second electrode in a first direction from the second electrode toward the first electrode and electrically connected to the second electrode,
    the second semiconductor region of a second conductivity type being located between the first electrode and the first semiconductor region in the first direction and being in contact with the first semiconductor region, and
    the third semiconductor region of the first conductivity type being located between the first electrode and the second semiconductor region in the first direction and being in contact with the second semiconductor region;
    a third electrode that is located between the first electrode and the first semiconductor region in the first direction and faces the second semiconductor region in a second direction intersecting the first direction;
    a first insulating region that is located between the third electrode and the first semiconductor region, the second semiconductor region, and the third semiconductor region;
    a second insulating region that is located between the third electrode and the first electrode;
    a fourth electrode that is located between the third electrode and the first semiconductor region in the first direction and that has a plurality of portions consecutive in the first direction, the plurality of portions including a first portion that has a first width in the second direction,
a second portion that is adjacent to the first portion, located closer to the second electrode than the first portion in the first direction, and has a second width smaller than the first width in the second direction, and
a third portion that is adjacent to the second portion, located closer to the second electrode than the second portion in the first direction, and has a third width larger than the second width in the second direction; and
a third insulating region that is located between the fourth electrode and the first semiconductor region, wherein
the plurality of portions of the fourth electrode include a fourth portion that is adjacent to the first portion, located closer to the first electrode than the first portion in the first direction, and has a fourth width larger than the first width in the second direction.

2. The semiconductor device according to claim 1, wherein the fourth electrode is electrically connected to the third electrode.

3. The semiconductor device according to claim 1, further comprising:
a fourth insulating region that is located between the fourth electrode and the third electrode,
wherein the fourth electrode is electrically connected to the first electrode.

4. The semiconductor device according to claim 1, wherein the plurality of portions of the fourth electrode include a fifth portion that is adjacent to the fourth portion, located closer to the first electrode than the fourth portion in the first direction, and has a fifth width larger than the fourth width in the second direction.

5. The semiconductor device according to claim 1, wherein the plurality of portions of the fourth electrode further include a sixth portion that is adjacent to the third portion, located closer to the second electrode than the third portion in the first direction, and has a sixth width smaller than the third width in the second direction.

6. The semiconductor device according to claim 5, wherein the plurality of portions of the fourth electrode further include a seventh portion that is adjacent to the sixth portion, located closer to the second electrode than the sixth portion in the first direction, and has a seventh width smaller than the sixth width in the second direction.

7. The semiconductor device according to claim 1, wherein the plurality of portions other than the second portion have a width increasing in the second direction as the width in the second direction increases from the second electrode toward the first electrode in the first direction.

8. The semiconductor device according to claim 1, wherein the plurality of portions includes two or more portions having a smaller width in the second direction than both adjacent portions in the first direction.

9. The semiconductor device according to claim 1, wherein
the first electrode is located on the third semiconductor region and electrically connected to the third semiconductor region; and
the second electrode is located under the first semiconductor region and electrically connected to the first semiconductor region.

10. A semiconductor device, comprising:
a first electrode;
a second electrode;
a semiconductor layer that includes a first semiconductor region of a first conductivity type, a second semiconductor region of a second conductivity type, and a third semiconductor region of the first conductivity type, the first semiconductor region of the first conductivity type being located between the first electrode and the second electrode in a first direction from the second electrode toward the first electrode and electrically connected to the second electrode,
the second semiconductor region of a second conductivity type being located between the first electrode and the first semiconductor region in the first direction and being in contact with the first semiconductor region, and
the third semiconductor region of the first conductivity type being located between the first electrode and the second semiconductor region in the first direction and being in contact with the second semiconductor region;
a third electrode that is located between the first electrode and the first semiconductor region in the first direction and faces the second semiconductor region in a second direction intersecting the first direction;
a first insulating region that is located between the third electrode and the first semiconductor region, the second semiconductor region, and the third semiconductor region;
a second insulating region that is located between the third electrode and the first electrode;
a fourth electrode that is located between the third electrode and the first semiconductor region in the first direction and that has a plurality of portions consecutive in the first direction, the plurality of portions including a first portion that has a first width in the second direction,
a second portion that is adjacent to the first portion, located closer to the second electrode than the first portion in the first direction, and has a second width smaller than the first width in the second direction, and
a third portion that is adjacent to the second portion, located closer to the second electrode than the second portion in the first direction, and has a third width larger than the second width in the second direction; and
a third insulating region that is located between the fourth electrode and the first semiconductor region, wherein
the first width is larger than the third width.

11. A semiconductor device, comprising:
a first electrode;
a second electrode;
a semiconductor layer that includes a first semiconductor region of a first conductivity type, a second semiconductor region of a second conductivity type, and a third semiconductor region of the first conductivity type, the first semiconductor region of the first conductivity type being located between the first electrode and the second electrode in a first direction from the second electrode toward the first electrode and electrically connected to the second electrode,
the second semiconductor region of a second conductivity type being located between the first electrode and the first semiconductor region in the first direction and being in contact with the first semiconductor region, and
the third semiconductor region of the first conductivity type being located between the first electrode and the second semiconductor region in the first direction and being in contact with the second semiconductor region;
a third electrode that is located between the first electrode and the first semiconductor region in the first direction and faces the second semiconductor region in a second direction intersecting the first direction;

a first insulating region that is located between the third electrode and the first semiconductor region, the second semiconductor region, and the third semiconductor region;

a second insulating region that is located between the third electrode and the first electrode;

a fourth electrode that is located between the third electrode and the first semiconductor region in the first direction and that has a plurality of portions consecutive in the first direction, the plurality of portions including a first portion that has a first width in the second direction, a second portion that is adjacent to the first portion, located closer to the second electrode than the first portion in the first direction, and has a second width smaller than the first width in the second direction, and a third portion that is adjacent to the second portion, located closer to the second electrode than the second portion in the first direction, and has a third width larger than the second width in the second direction; and a third insulating region that is located between the fourth electrode and the first semiconductor region, wherein a portion located closest to the first electrode in the first direction among the plurality of portions has a length L1 in the first direction and a width W1 in the second direction, a portion adjacent to the portion located closest to the first electrode among the plurality of portions has a length L2 in the first direction and a width W2 in the second direction, and a relationship of $(W1/L1)/(W2/L2) > 2.5$ is satisfied.

* * * * *